(12) United States Patent
Humayun et al.

(10) Patent No.: US 6,905,556 B1
(45) Date of Patent: *Jun. 14, 2005

(54) METHOD AND APPARATUS FOR USING SURFACTANTS IN SUPERCRITICAL FLUID PROCESSING OF WAFERS

(75) Inventors: Raashina Humayun, San Jose, CA (US); Patrick C. Joyce, Fremont, CA (US); Adrianne Kay Tipton, Fremont, CA (US); Krishnan Shrinivasan, San Jose, CA (US); Dennis W. Hess, Atlanta, GA (US); Satyanarayana Myneni, Atlanta, GA (US); Souvik Banerjee, Fremont, CA (US)

(73) Assignee: Novellus Systems, Inc., San Jose, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 10/306,677

(22) Filed: Nov. 27, 2002

Related U.S. Application Data

(63) Continuation-in-part of application No. 10/202,987, filed on Jul. 23, 2002.

(51) Int. Cl.[7] .............................................. B08B 3/00
(52) U.S. Cl. ............................... 134/36; 134/2; 134/3; 134/31; 510/175
(58) Field of Search ........................... 134/2, 3, 31, 34, 134/36, 19, 26, 28, 29, 30, 41, 35, 42, 902; 510/175

(56) References Cited

U.S. PATENT DOCUMENTS

| | | | |
|---|---|---|---|
| 5,683,977 A | 11/1997 | Jureller et al. | 510/286 |
| 5,783,082 A | 7/1998 | DeSimone et al. | 210/634 |
| 5,866,005 A | 2/1999 | DeSimone et al. | 210/634 |
| 5,868,856 A | 2/1999 | Douglas et al. | 134/2 |
| 5,868,862 A | 2/1999 | Douglas et al. | 134/26 |
| 5,944,996 A | 8/1999 | DeSimone et al. | 210/634 |
| 6,024,801 A | 2/2000 | Wallace et al. | 134/1 |
| 6,187,383 B1 * | 2/2001 | McClain et al. | 427/388.1 |
| 6,224,774 B1 | 5/2001 | DeSimone et al. | 210/634 |
| 6,228,826 B1 | 5/2001 | DeYoung et al. | 510/291 |
| 6,242,165 B1 * | 6/2001 | Vaartstra | 430/329 |
| 2002/0046707 A1 | 4/2002 | Biberger et al. | 118/733 |
| 2002/0112740 A1 * | 8/2002 | DeYoung et al. | 134/3 |
| 2002/0112746 A1 * | 8/2002 | DeYoung et al. | 134/36 |
| 2002/0179126 A1 * | 12/2002 | DeYoung et al. | 134/36 |
| 2003/0125225 A1 * | 7/2003 | Xu et al. | 510/175 |

FOREIGN PATENT DOCUMENTS

JP    S64-45131    2/1989    ......... H01L/21/316

OTHER PUBLICATIONS

Hawley's Condensed Chemical Dictionary. John Wiley & Sons, Inc. pp. 151,240, 1997.*

U.S. Appl. No. 10/067,520, filed Feb. 5, 2002.

U.S. Appl. No. 10/202,987, filed Jul. 23, 2002.

* cited by examiner

*Primary Examiner*—M. Kornakov
(74) *Attorney, Agent, or Firm*—Beyer Weaver & Thomas, LLP

(57) ABSTRACT

A method of delivering a reagent to a wafer is provided. A solvent is provided. A set of conditions of temperature and pressure is provided to the solvent, which is sufficient to bring the solvent to supercritical conditions. A reagent is provided. A surfactant is provided, where the surfactant has a first moiety with an affinity for the solvent and a second moiety with an affinity for the reagent, where the surfactant increases the concentration of the reagent that may be carried by the solvent. The solvent, surfactant, and reagent are combined to form a solution. The solution is delivered to a supercritical process chamber, wherein a wafer is exposed to the solution in the process chamber.

12 Claims, 4 Drawing Sheets

METHOD AND APPARATUS FOR USING SURFACTANTS IN SUPERCRITICAL FLUID PROCESSING OF WAFERS

CROSS REFERENCE TO RELATED APPLICATIONS

This application is a continuation-in-part which claims priority under 35 U.S.C. § 120 from U.S. application Ser. No. 10/202,987, having Patrick C. Joyce et al. as inventors, filed Jul. 23, 2002, and titled "Supercritical Solutions for Cleaning Photoresist and Post Etch Residues from Low-K Materials," which is incorporated herein by reference for all purposes.

BACKGROUND OF THE INVENTION

Wafer cleaning in modern ULSI semiconductor processing presents numerous engineering dilemmas. At various stages during integrated circuit (IC) fabrication, photoresist, residues, and/or particles must be stripped and/or cleaned from wafers. In the evolution of wafer cleaning, the industry previously employed strong acids, bases, solvents, and oxidizing agents in wet chemical procedures. The wet chemical cleaning agents include such chemicals as sulfuric acid, hydrochloric acid, hydrofluoric acid, ammonium hydroxide, and hydrogen peroxide. Although these chemicals are capable of removing unwanted materials from a wafer substrate, the aqueous solutions commonly used for cleaning have difficulty moving into and subsequently leaving the small features (less than 100 nm) on advanced ICs due to surface tension limitations of the liquid. Wet clean solutions have also been shown to be difficult to remove from the pores commonly found in advanced low-k films. In addition, feature distortion, sticking, or pore collapse may occur due to surface tension effects during drying after wet processing. Another limitation of traditional wet clean processes is the large amount of highly toxic chemical waste that can be generated. New technologies are required for next generation chip manufacturing processes.

Among the methods under development are high-pressure processes that employ "densified" process solutions. Densified fluids are supercritical or near critical solvents such as supercritical carbon dioxide. Although supercritical fluids are generating interest as potential wafer cleaning agents, they present their own unique set of engineering challenges. In particular, the cleaning fluid should strongly but selectively solvate or otherwise strip and clean photoresist, residue, contaminant, or whatever else needs to be removed from the wafer.

Some researchers have suggested the addition of additives to supercritical carbon dioxide. See, e.g., U.S. Pat. Nos. 5,944,996 and 5,783,082. Other researchers have suggested the use of oxidizing agents such as oxygen. See JP Patent Document No. S64-45131. Still other researchers have proposed specific additive combinations for removing specific contaminants. See, e.g., U.S. Pat. Nos. 5,868,862, 5,868,856, 6,024,801, and 5,866,005.

SUMMARY OF THE INVENTION

To achieve the foregoing and in accordance with the purpose of the present invention, a method of delivering a reagent to a wafer is provided. A solvent is provided. A set of conditions of temperature and pressure is provided to the solvent, which is sufficient to bring the solvent to supercritical conditions. A reagent is provided. A surfactant is provided, where the surfactant has a first moiety with an affinity for the solvent and a second moiety with an affinity for the reagent, where the surfactant increases the concentration of the reagent that may be carried by the solvent. The solvent, surfactant, and reagent are combined to form a solution. The solution is delivered to a supercritical process chamber, wherein a wafer is exposed to the solution in the process chamber.

In another embodiment of the invention, a method of delivering a reagent to a supercritical process chamber is provided. In a container separate from the supercritical process chamber, a solvent is provided. A surfactant is provided to the container. One or more reagents are provided to the container. A set of conditions of temperature and pressure sufficient to bring the solvent to supercritical conditions is provided to the container. A resulting supercritical solution is provided to a supercritical process chamber.

The detailed description below will further discuss the benefits and features of this invention.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

Introduction

Figure 1:
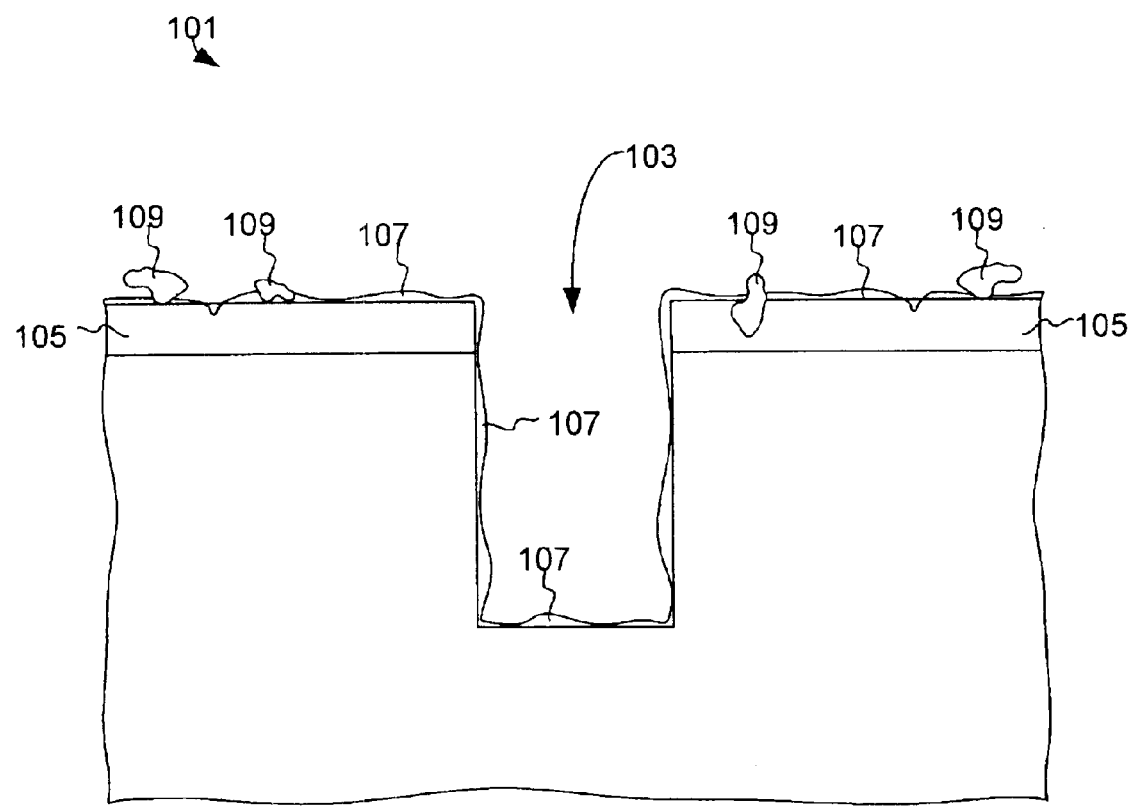
FIG. 1 is a schematic illustration of a partially fabricated integrated circuit structure after etching and including various waste materials that must be removed.

This application pertains to methods of cleaning substrates with supercritical cleaning solutions. In many embodiments, the substrate of interest is a wafer. As used herein, the term "wafer" generally refers to a semiconductor wafer as such wafer exists during any of many stages of integrated circuit fabrication thereon.

Numerous integrated circuit fabrication processes generate waste material, which must be removed from the wafer before subsequent process steps. These processes include post-photolithography, etching, implanting, planarization (e.g., chemical mechanical polishing), etc. In many processes, the resulting waste products are polymeric materials such as photoresists, and the residue or "crust" resulting from post-etch and post-implant steps. The photoresists may be either a positive or a negative photoresist of various compositions. For example, the photoresist may be a novolac resin (poly(4-hydroxy 2-methylstyrene) or poly(4-vinyl 3-methylphenol)), poly-hydroxylstyrene, poly-methylmethacrylate, in some cases siloxanes, poly-norbornanes, and the like. In other processes, the waste products are metal residues, particles, highly-carbonized residues, fluorocarbon based residues, polishing residues, and the like. Examples of metals commonly encountered in integrated circuit fabrication include copper, aluminum, titanium, tungsten, and their oxides and nitrides. Other residue materials that may be encountered include silicon, silicon dioxide, and various silicides. Any of these may be cleaned using supercritical solutions in accordance with this invention.

Supercritical $CO_2$ (the most commonly used SCF) alone is not sufficient to clean the stubborn residue typically found on a processed substrate. Removal of these materials requires a more aggressive approach to chemically break down such materials as etch-exposed resist and plasma created residues. Removal of metals is also extremely difficult in supercritical $CO_2$, as metals typically have limited to no solubility. In the case of wet cleans, these materials are broken down and/or dissolved using aggressive chemistries involving strong acids, bases, and oxidizers often in an aqueous phase. It would be desirable to use these chemistries to enhance the cleaning capability of a SCF. Unfortunately, water, highly polar organic and inorganic chemicals, and metals often do not readily dissolve into $CO_2$ or other nonpolar SCFs.

Although it is not possible to directly dissolve these mixtures into many SCFs, it is possible to form stable microemulsions where locally concentrated droplets will exist in the supercritical phase. These microemulsions are formed using a surfactant. Certain surfactants can also be used to chelate residual metals, thereby allowing a method for dissolving undesirable metals.

A surfactant for a supercritical process will generally be a relatively long-chain molecule that contains two functional groups. The 'tail' of the surfactant will have an affinity for the supercritical phase while the 'head' will be attracted to the species to be dissolved in the SCF. The species to be dissolved could either be a reactant or reagent that would attack the residue or byproducts of the residue breakdown process. One of the more commonly studied applications involves forming water reverse micelles in supercritical $CO_2$ using a neutralized KRYTOX® molecule. The KRYTOX® molecule has a long, fluorinated tail that has an affinity for $CO_2$, while the head is an ammonium cation that is attracted to the water molecules.

The present invention provides supercritical cleaning solutions and methods of using such solutions to remove some or all of the waste products generated by the various integrated circuit processing operations. In one embodiment, supercritical cleaning solutions of similar compositions are used at various stages during the course of an integrated circuit fabrication sequence to remove various types of waste. In another embodiment, the cleaning solution attacks different types of waste so that the wafer surface can be completely cleaned in a single operation.

In some cleaning operations, a supercritical solution, such as one of those described below, cleans both photoresist and residue from a wafer surface after photolithography and etching or implant. In later operations, a cleaning solution of another composition (or possibly the same composition) may be employed to clean sputtered metal from the surface of a semiconductor wafer. Other particles may be cleaned by the same or similar solutions in even later process steps. Of course, solutions used in different steps may also be very different.

To provide a rough illustration of the condition of a wafer surface after a typical etching step, FIG. 1 is provided. As shown there, a partially fabricated integrated circuit surface 101 includes an etched recess 103. Recess 103 was previously defined by a pattern in a layer of photoresist 105. Note that photoresist layer 105 remains on the wafer surface after the etching operation is complete. It must be removed prior to subsequent processing.

A thin irregular layer of residue 107 adheres to the walls of recess 103 as well as the field regions outside the recess. Some of the residue may penetrate into the polymer matrix of photoresist 105. In addition to the residue, various particles 109 (typically of submicron size) are distributed over the wafer surface. These particles are composed of etched metal or other material generated in the process. Like the residue, they may be embedded in the polymer matrix. In accordance with this invention, a processing operation employs a single supercritical cleaning solution (comprised of various components) to remove the particles 109, the residue 107, and the photoresist 105. The various components employed in the cleaning solution attack different types of waste so that the wafer surface can be completely cleaned in a single operation. Even the residue embedded in the photoresist can be removed in a single operation.

Supercritical Solution Composition

As indicated, this invention pertains to the use of supercritical solutions for cleaning substrates. Supercritical fluids exist when the temperature and pressure of the fluid are above the critical temperature and pressure for that fluid. For example, the critical temperature and pressure for carbon dioxide are 31.0° C. and 73.9 bar (1070 psig). In the supercritical state, there is no differentiation between the liquid and gas phases and the fluid can be viewed as a dense gas in which the saturated vapor and saturated liquid states are identical. Near critical fluids or solutions exist when the temperature and pressure of a solution are both greater than 80% of their critical point, but the solution is not yet in the supercritical phase. Due to their high density, supercritical and near critical fluids possess superior solvating properties. In this application, when a fluid is referred to as "supercritical", it is understood to cover both supercritical and near critical conditions.

In the context of this invention, the supercritical solutions may be solutions including both a solvent and one or more solutes. The solute may be a reagent, another solvent, or other material useful in cleaning the wafer. In some embodiments, the supercritical solution contains a primary solvent and one or more co-solvents.

While the description presented herein focuses on carbon dioxide as a primary solvent, other condensable gases in the supercritical state could be substituted for carbon dioxide. Examples of such gases include carbon monoxide (CO), nitrous oxide ($N_2O$), xenon, hydrogen sulfide, ethanethiol, alkanes (from C1–C7, linear, branched, and ring structures; hexane for example), alkenes (e.g. ethylene and propylene), aromatics (toluene, benzene, and xylene), alcohols (C1–C5, linear and branched), acetone, hexafluoroacetone, alkyl amines (e.g., methyl amine, dimethyl amine, trimethyl amine, and ethyl amine), sulfur hexafluoride, ammonia, water, and chloro, fluoro, and freon short-chain molecules (e.g., $C_2F_6$, $CHClF_2$, $CCl_4$, $CF_4$, $CHF_3$).

A wide range of solutes and other additives may be provided with the supercritical solvent to augment the cleaning capability of the supercritical cleaning solution. These additives will generally be called reagents in this application.

Figure 2:
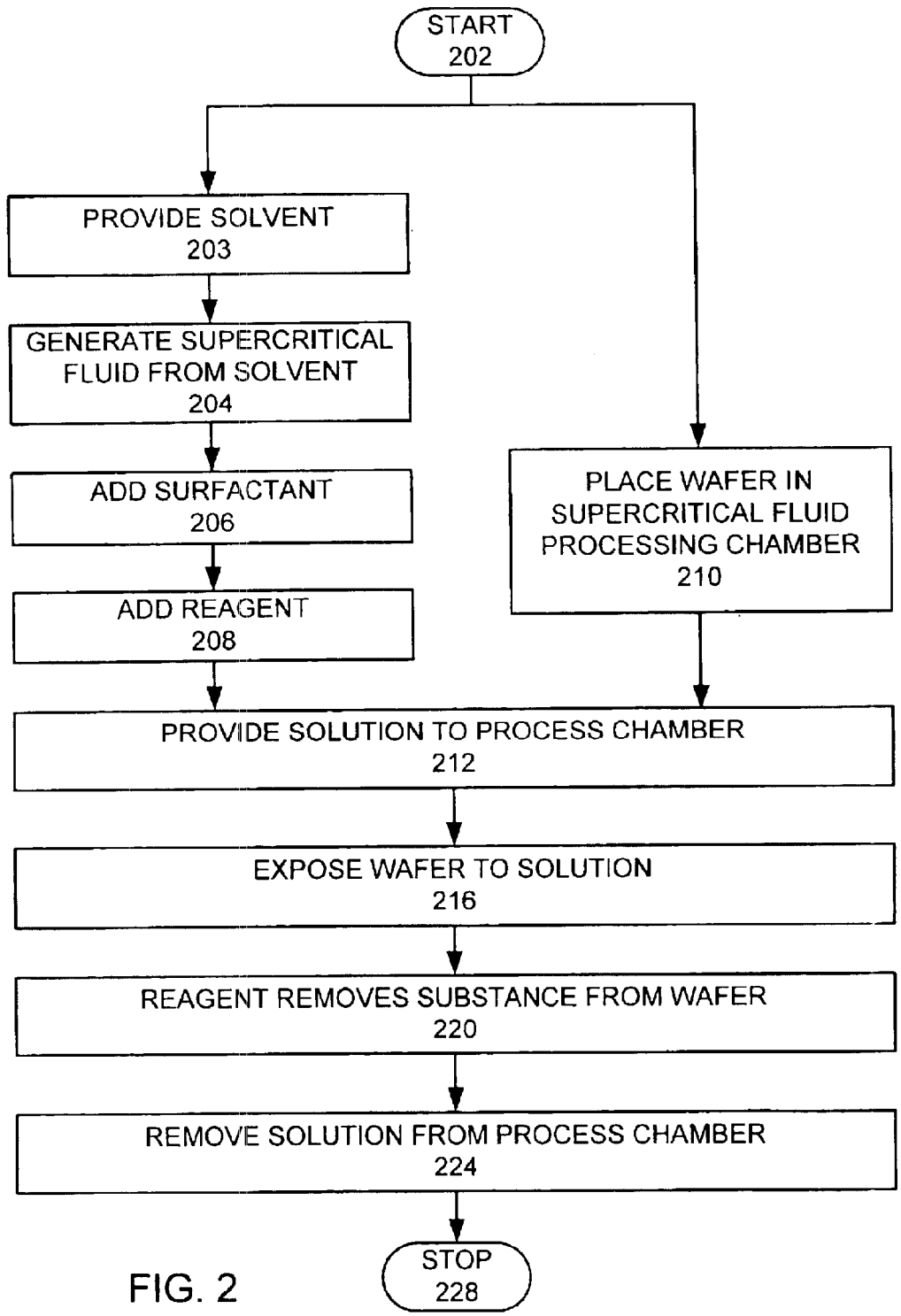
FIG. 2 is a flow chart of a process used in a preferred embodiment of the invention.
Figure 3:
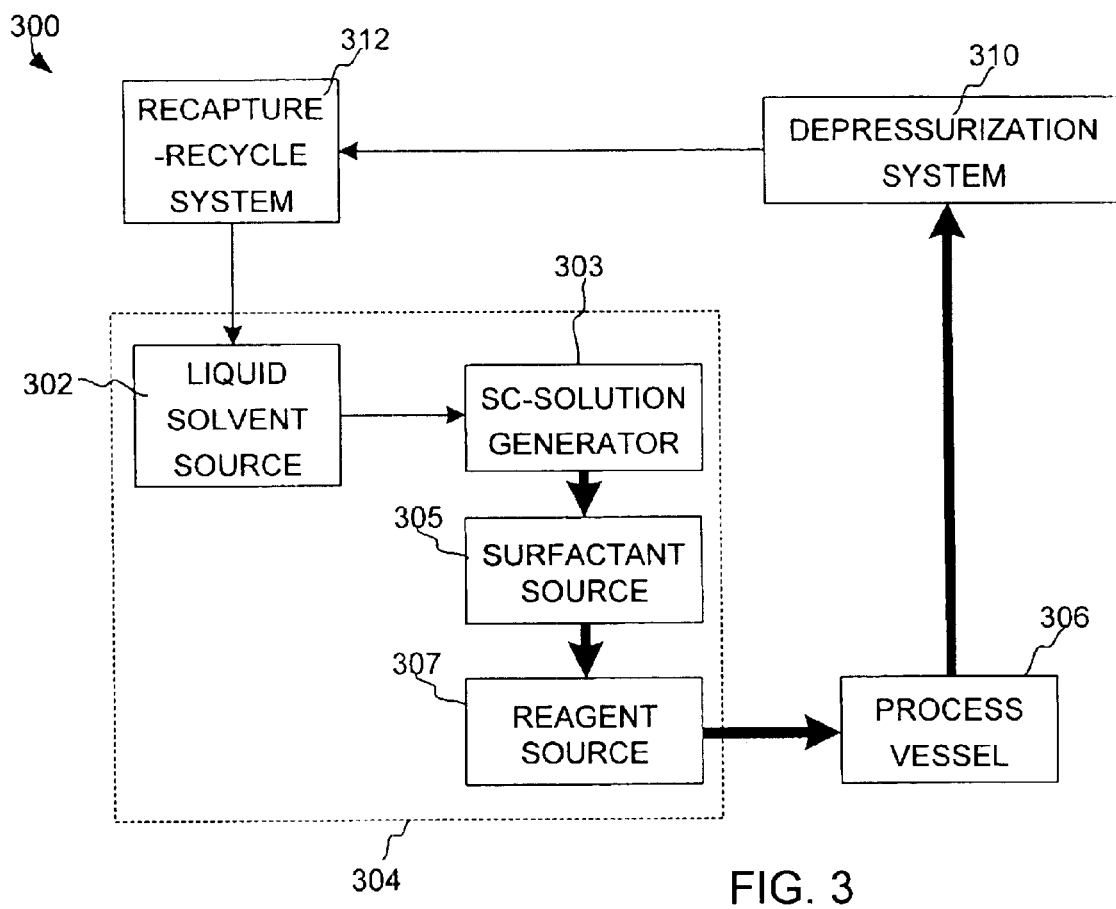
FIG. 3 is a schematic view of a system used in a preferred embodiment of the system.

It is desirable to increase the concentration of a reagent in a solvent to increase the effectiveness of the solution. FIG. 2 is a flow chart of a preferred embodiment of the inventive process that provides for a more effective supercritical fluid. FIG. 3 is a schematic view of a system 300 that may use the process shown in FIG. 2. Included in wafer cleaning system 300 are a supercritical solution delivery mechanism 304 (bounded by the dotted line), a process vessel 306, a depressurization system 310, and a recapture-recycle system 312. The supercritical solution delivery mechanism 304 includes a liquid solvent source 302, supercritical solution generator 303, a surfactant source 305, and a reagent source 307. Note that the heavy arrows in FIG. 3 depict regions where the solution exists in the supercritical state and the fine arrows depict regions the solution exists in the sub-critical state.

In a preferred embodiment, a solvent is provided by the liquid solvent source 302 of the supercritical solution delivery mechanism 304 (step 203). At this stage, the solvent is a sub-critical liquid solvent (for example, liquid carbon dioxide). A supercritical fluid is generated from the solvent by the supercritical (SC)-solution generator 303 (step 204). A surfactant from the surfactant source 305 is added to the solvent to form a supercritical solution (step 206). A reagent from the reagent source 307 is added to the solution (step 208). The resulting solution is delivered to the supercritical process vessel 306 (step 212), where a wafer has been placed (step 210). The supercritical solution contacts the wafer or wafers held within process vessel 306 (step 216). The reagent removes a substance, such as photoresist residue, from the wafer (step 220). After processing the wafers, the supercritical solution is vented via depressurization system 310 (step 224). Sub-critical solvent exits system 310 and is recaptured and processed (preferably recycled) in recapture-recycle system 312. Purified solvents from system 312 are reintroduced into solvent delivery mechanism 304 in a sub-critical state.

The reagent may be a specific type; e.g., ammonium hydroxides, fluoride sources, an organic acid, a peroxide source, and combinations thereof. Other preferred embodiments provide that the reagent may be a chelating agent or an anticorrosion agent, a cleaning agent, an etching agent, or a deposition agent. The reagent may also be a co-solvent, which is made more soluble by the surfactant.

The general criteria for any solvent, surfactant, and reagent combination for a supercritical solution include the following: First, the surfactant should provide a solubility of the reagent into the supercritical fluid of at least about 0.1% by volume to impart significant functionality. Second, the reagent should not react with the solvent, for example, to produce an insoluble product. Thus, for example, primary and secondary amines usually are not acceptable reagents when supercritical carbon dioxide is the solvent. Third, the additives should be chosen so that they should not cross-react or otherwise detrimentally interact with one another. In certain situations, some limited cross-reaction may be beneficial. For example, it may be possible and beneficial to generate carbonic acid ($H_2CO_3$) on the wafer surface from the interaction of water and carbon dioxide solvent. Finally, the surfactant should increase the concentration of the reagent that may be carried by the supercritical solvent by at least a factor of two over the concentration of the reagent carried in the supercritical solvent without the surfactant. The reagent is carried in the supercritical solvent by being soluble in and/or in the form of a stable microemulsion of the component in the supercritical phase. For example, neutralized KRYTOX® molecules can raise the solubility of water in $CO_2$ by a factor of more than two, and it forms a stable water microemulsion in $CO_2$. In the specification and claims a reagent being carried in the supercritical solvent includes dissolving a reagent in a supercritical fluid or forming the reagent in a stable microemulsion in the supercritical solvent. In another embodiment the surfactant increases the concentration of reagent carried in the supercritical solvent by at least a factor of three. In another embodiment the surfactant increases the concentration of the reagent carried in the supercritical solvent by at least a factor of four.

At least one reagent is combined with the solvent. The reagent generally is insoluble or sparingly soluble in the solvent, even at supercriticality. The surfactant is used to bring the reagent into the supercritical solvent, and thus form a supercritical solution. The surfactant solubilizes the reagent by either forming reactant-containing micellular structures in the supercritical solvent or aiding in dissolution of the reagent into the supercritical solvent, both of which allow the solvent to carry a higher concentration of the reagent. The combination of the supercritical solvent, the reagent, and the surfactant forms a supercritical solution of the invention. The supercritical solution is then delivered to the supercritical process chamber for further use, preferably in wafer processing. Preferably, the surfactant includes a bi-functional molecular structure, such as where a first moiety has an affinity for the supercritical solvent and a second moiety has an affinity for the reagent (or reagents).

Polymer Removal

In one preferred embodiment for polymer removal, the reagents are directly responsible for removing polymer or other waste materials from the wafer surface. Reagents for removing polymers generally fall into one or more classes based on mechanism of action: (1) agents that separate or break apart polymers or other residues by physical action, and (2) reactants that break down polymers or other residues by breaking chemical bonds.

Within the first class of agents are "swelling" agents. Generally, swelling agents will have a chemical affinity for the moieties of the polymer to be removed. For example, if a photoresist is perfluorinated, then a swelling reagent having —$CF_2$— moieties will often be useful. These agents interact with the polymer photoresist or other residue and may cause it to increase in volume to a point where it physically breaks apart from the underlying substrate and can be more easily swept away by flowing solution or dissolved.

Useful reagent swelling agents include almost all tertiary amines. Specific examples include N-methylpyrrolidinone (NMP), dimethylformamide (DMF), dimethylethanolamine, methyldiethanolamine, triethanolamine, and pyridine. Note that tertiary amines tend to break bonds in polymeric photoresists and thereby promote some degree of swelling.

Glycols and polyethers also facilitate swelling of polymers. Examples of suitable glycols include the simpler glycols such as ethylene glycol. Examples of suitable polyethers include glyme, diglyme, diethyleneglycol diethylether, and carbitols.

Still further, many fluorinated compounds and salts can act as useful swelling reagents. Examples include perfluoroacetamide, ammonium fluoride, t-butyl ammonium fluoride, and other ammonium fluorides such as n-propyl, isopropyl, and n-butyl ammonium fluorides. These may also act to break chemical bonds. Still other swelling reagents include acetone and acetonitrile.

Reactant type reagents (the second reagent type identified above) break chemical bonds. These agents may completely degrade the polymer to effect removal. Alternatively, they may modify or weaken the polymer to render it more soluble in the supercritical solution. The reactant may attack the bonds of the polymer itself or the bonds between the polymer and the substrate. If it attacks the bonds of the polymer itself, it may serve to de-polymerize the material.

Of the reagents that break chemical bonds, many act as reactant reagents in typical chemical reactions. These reagents are consumed during the cleaning process. Examples of such reagents include oxidizing agents such as peracids and peroxides. Specific examples of peracids include peracetic acid, and meta-chloroperbenzoic acid. Specific examples of peroxides include hydrogen peroxide, urea hydroperoxide, and organic peroxides, such as benzoyl peroxide, and particularly dialkyl peroxides such as di-tertiary butyl peroxide.

Another reactant category is the catalytic reagent. These are agents that catalyze the breakdown, dissolution, or other degradation reaction of a waste product. Some catalytic reagents act by facilitating generation of radicals. This allows a variety of reactions to take place more rapidly. In one example, the reagent catalyzes abstraction of a certain atom from a molecule; e.g., removing a fluorine atom and replacing it with a hydrogen atom. Other suitable reagents acting by one or more of the above mechanisms of action include acetic acid, DMSO, THF, water, and propylene carbonate. Again, these compounds may, in some cases, have a dual function within a supercritical cleaning solution: reagent and co-solvent.

The choice of surfactants is strongly dependant on both the supercritical fluid of interest and the desired reagent to be brought into the SCF phase or the material to be removed from the surface. Typically, a surfactant will have a polar end and a nonpolar end because the purpose of the surfactant is to encourage solubility in dissimilar molecules (a highly polar molecule will often not dissolve in a nonpolar solvent). In the case of $CO_2$, typical surfactants would have tails including siloxane groups or fluorinated organic groups (although other tails are possible). In the example of forming water microemulsions in $CO_2$, the head group will have a polar functional group such as an ammonium cation (although it should be noted many other head groups may also used).

Reagents as Chelating Agents

Chelating agents bond with metal ions to produce a complex that is soluble in the supercritical cleaning solution. This makes the metal ion soluble at a higher concentration than would be otherwise possible without the chelating agent. Chelating agents with high solubility in supercritical carbon dioxide (or other supercritical primary solvent) are preferred. Generally, traditional chelating agents for organic chemistry can be used with supercritical carbon dioxide. The chelating agents may be targeted to alkali metal ions, alkaline earth metal ions, transition metal ions, etc. as the case may be. In the residues and particles generated during integrated circuit fabrication processes, one commonly encounters the following metals, all of which may be chelated: aluminum, tungsten, copper, sodium, titanium, tantalum, cobalt, iron, chromium, etc.

Chemical classes of chelating agents include □-diketones, ethers (e.g., crown ethers), phenols (including catecols and sterically hindered phenols such as gallic acid), certain alcohols, and fluorinated versions (typically perfluorinated) of any of these, as well as tertiary diamines. Specific examples of chelating agents include acetylacetone, catechol, EDTA, and hfac (hexafluoroacetylacetone). Generally, these agents are effective at chelating ions of alkali metals, alkaline earth metals, transition metals, and main group metals. Many are especially useful in chelating copper ions.

The use of surfactants for metal cleaning can take two approaches. In the first approach, the head of the surfactant molecule will actually bind to the undesired metal and allow it to be dissolved into the supercritical phase. For example, it is possible to dissolve chromium into carbon dioxide using a surfactant with a □-diketone head group to bind to the metal and a fluoroether tail to give solubility in the SCF. A second approach would be the formation of reverse micelles with the surfactant, thus forming a microemulsion in the SCF that would have an affinity for the undesired metal contaminants.

Reagent as Anticorrosion Agents

In certain regards, these anticorrosion agents overlap with the chelating agents, although they have a different goal. Anticorrosion agents are added to prevent uncontrolled oxidation of an exposed metal surface. Sometimes this protection is referred to as passivation. Damaging oxidation could otherwise occur when wafers are removed from processing apparatus and stored or moved through the ambient atmosphere.

Unlike chelating agents, anticorrosion agents must adsorb to or otherwise adhere to the substrate metal surface. Still, they must have an affinity for metal in order to provide protection from oxidation. Preferably, they easily release from the metal surface upon heating, evacuation, or other preferably benign stimulus.

Suitable anticorrosion reagents are often compounds with sterically hindered sites. Ortho- and meta-dihydroxybenzenes such as catechol are examples. Other examples include gallic acid, glymes, glycols, and derivatives of these.

As before, the surfactant could be used to either form reverse micelles for allowing transport of normally undissolvable components into the SCF, or potentially a surfactant could be chosen that could bind to the metal surface to act as the anticorrosion agent.

Surfactants

In supercritical carbon dioxide, surfactants may form reverse micelles, having a $CO_2$-philic tail portion and a water-philic head portion. The reagent forms the cores of these micelle species. Surfactants can be anionic, cationic, or neutral. Classes of surfactant include acids, amines, and the like. Specific examples of $CO_2$-philic groups for the surfactants include siloxane groups and fluorinated organic groups.

The concentration of surfactant is frequently limited by solubility. Preferably, the concentration of surfactant in the supercritical solvent ranges up to about 50% by volume, more preferably between about 0.1 and 30% by volume. Obviously, the actual concentration chosen will depend upon the size and chemical composition of the particles to be removed. Water may be present in solution with the surfactant.

In addition to having surfactants that are bi-functional with $CO_2$-philic and water-philic moieties, other surfactants may be a bi-functional molecule that has a non-polar moiety and a polar moiety. For example, a surfactant may be bi-functional with a lipophilic head and hydrophilic tail. In another example, a surfactant may be a bi-functional molecule where both the head and the tail are nonpolar, where the nonpolar head is designed to solubilize/bind/complex a large $CO_2$ insoluble species and the $CO_2$ philic tail helps keep the larger conglomeration in solution. Other surfactants may be multifunctional molecules or even mixtures of molecules that act as surfactants.

Methods of Cleaning Semiconductor Wafers

As indicated above, the processes of this invention may be employed to clean a partially fabricated semiconductor wafer after many of the various fabrication steps. These may be front-end steps employed to form circuit elements on the underlying single crystal semiconductor substrate or back-end steps employed to produce the wiring between the circuit elements created during front-end processing. Cleaning may be performed before, during, or after any of the unit operations of integrated circuit fabrication. These operations include, for example, etching, implantation, deposition, and oxidation. After ion implantation, the supercritical cleaning solution may remove photoresist and certain residues such as arsenic oxide, phosphorus oxide, silicon oxide, and/or boron oxide. After etching, the cleaning solution may remove photoresist and whatever material has been etched away (metals, metal oxides, dielectrics, fluorocarbons, and the like). Cleaning may also be performed prior to deposition or after planarization (e.g., chemical mechanical polishing). To this end, the cleaning solution may remove oxides and/or provide an anticorrosion barrier on exposed metal surfaces.

Thus, this invention provides a holistic approach applicable to cleaning multiple different types of integrated circuit fabrication waste products. Stated another way, the invention may employ the same or a similar supercritical cleaning solution across multiple process steps. An example of one sequence is as follows: (1) perform photolithography and etching or implanting; (2) remove photoresist, residue, and particles with a supercritical cleaning solution; (3) sputter or otherwise deposit an overlayer and optionally planarize; (4) using a similar supercritical cleaning solution, remove particles and/or residue remaining from deposition and/or planarization steps.

The invention may be particularly useful for cleaning contaminants from low-k materials. As mentioned, in methods of this invention, preferably the supercritical cleaning solution includes supercritical carbon dioxide together with a reagent and a surfactant of the types described above.

In methods of the invention, preferably the pressure within the chamber is between about 500 and 10000 psi during exposure of the wafer to the supercritical solution. Preferably, the temperature within the chamber is maintained at between about 30° C. and 150° C. Preferably, the contact with at least one surface of the wafer is maintained for a period of between about 1 and 60 minutes. More specific conditions, which fall within the above parameters, for methods of the invention are described below in relation to particular chemistries. After treatment of the wafer with the supercritical solution, preferably methods of the invention further include rinsing the semiconductor wafer with at least one of deionized water, an organic solvent, the supercritical solvent, and mixtures thereof.

In a particularly preferred method, the supercritical cleaning solution includes supercritical carbon dioxide with water and TMAH, and using a surfactant such as a PFPE polymer w/an ammonium cation head (such as neutralized KRYTOX® molecules). Preferably, the temperature within the chamber is maintained at between about 30° C. and 70° C., more preferably about 50° C. Preferably the contact with at least one surface of the wafer is maintained for a period of between about 1 and 60 minutes, more preferably between about 1 and 10 minutes.

Apparatus for Cleaning with Supercritical Solutions

This invention is not limited to any particular apparatus. Generally, the apparatus will include a chamber (sometimes referred to as a process vessel) that houses one or more wafers during cleaning. The chamber should maintain the wafer in a defined position or positions (with or without motion within that position, e.g. rotation, vibration, or other agitation) during contact with the supercritical cleaning solution. Preferably, the cleaning solution flows over the wafer or is agitated in the chamber.

Generally, the cleaning solutions of this invention may be employed to clean wafers in any batch or continuous processing apparatus. However, one particularly preferred apparatus continuously recirculates supercritical cleaning solution through a process vessel housing one or more wafers during cleaning. Further embodiments and more details can be found in U.S. patent application Ser. No. 10/067,520, filed on Feb. 5, 2002 by K. Shrinivasan et al., and entitled, "Apparatus and Methods for Processing Semiconductor Substrates Using Supercritical Fluids." That patent document is incorporated herein by reference for all purposes.

Figure 4:
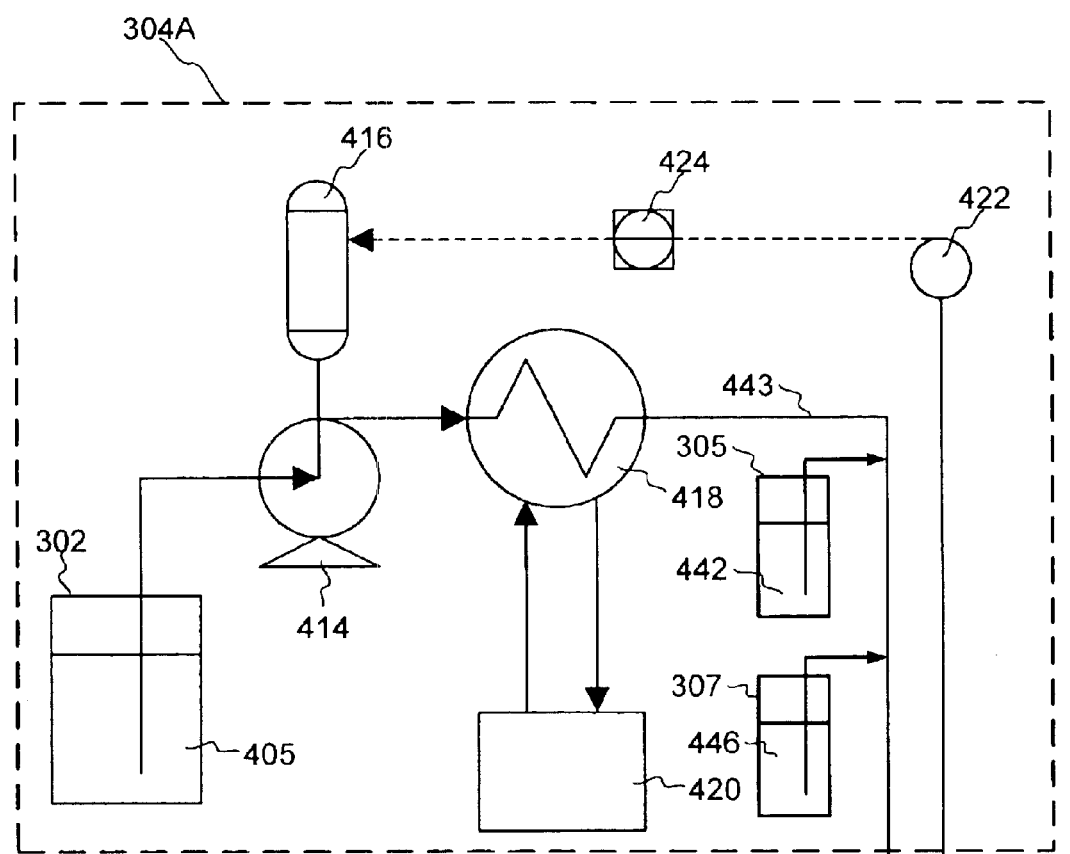
FIG. 4 is a more detailed view of a solvent delivery mechanism.
Figure 4:
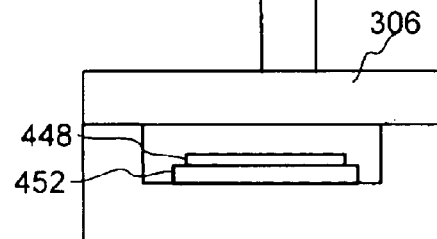

FIG. 4 shows one specific embodiment of the supercritical solution delivery mechanism 304 that may be employed with this invention. In this case, a solvent delivery mechanism, 304A, is depicted (within the dotted line area). Solvent delivery mechanism 304A includes a solvent source 302. Solvent source 302 in many cases is a dewar. Source 302 contains a sub-critical liquid solvent 405. Solvent 405 is delivered to a pump 414 (via a container, such as an eductor tube). Pump 414 pressurizes solvent 405 and delivers it to a heat exchanger 418. Heat exchanger 418 receives heat from a heater 420. In this example, heater 420 provides heat to heat exchanger 418 via circulation of a heated fluid through the heat exchanger. Such heat exchangers for this purpose include various forms such as parallel plate, shell and tube, coaxial coil, and the like. Alternatively, electrical resistance heaters may be imbedded directly in heat exchanger 418.

Pump 414 pressurizes sub-critical solvent 405, and the pressurized fluid is then heated by heat exchanger 418. The combination of pressurization by pump 414 and heating by heat exchanger 418 creates a supercritical solvent. Solvent 405 is maintained at a temperature below its critical temperature. Pump 414 pressurizes solvent 405 to at least its critical pressure, thus creating a pressurized fluid. The critical pressure is the pressure at which the solvent would turn supercritical if it were at its critical temperature. In this case, since sub-critical solvent 405 is well below its critical temperature when it reaches pump 414, it does not reach a supercritical state within pump 414. The pressurized liquid is then delivered to heat exchanger 418, where it is heated to at least its critical temperature. This converts the pressurized liquid to a supercritical fluid. A surfactant source 305, such as a dewar with a surfactant 442 provides the surfactant 442 to the solvent 405 in a piping 443 to form a supercritical solution. A reagent source 307 likewise provides a reagent 446 to the solution to form the supercritical solution. After the mixture of supercritical solvent, surfactant, and reagent are well mixed, the supercritical solution is then delivered to the supercritical process vessel 306, which supports a wafer 448 on a wafer support 452.

The supercritical solution delivery mechanism 304A delivers supercritical cleaning solution directly into process vessel 306. In this example, a pressure sensor 422 measures process vessel pressure. It provides this information to a pressure controller 424. Pressure controller 424 can be programmed to ramp pressure at a given rate. Once the desired process vessel pressure is achieved, pressure controller 424 controls the pressure of the system by use of a closed-loop algorithm, such as a proportional integral derivative or PID. Such control is achieved by controlling the pumping rate of pump 414 via motor 416 to reach the target pressure.

Preferably, the solvent is made into a supercritical fluid by providing a set of conditions of temperature and pressure sufficient to bring the solvent to supercritical conditions before the surfactant is added. Preferably the surfactant is added before the reagent. However, the invention is not necessarily limited to performing these steps in this order. For example, the reagent and surfactant may be premixed and pumped together into the supercritical solvent, or the surfactant may be added to the solvent before the solvent is made supercritical.

In an alternative embodiment, the reagent source 307 may provide a first and a second reagent 446, where the solubility of the first and second reagent 446 into the solvent is increased by the surfactant. In the alternative, separate first and second reagent sources may be used to provide first and second reagents.

Preferably, the mixing of the solvent, surfactant, and reagent is performed in a solution container external to the process vessel 306. The container may be a vessel, chamber, pipe, or some object used to provide some containment of the solution. The solution container may be a series of chambers or pipes, where the solvent and surfactant is mixed in one chamber and the reagent is added in another chamber.

In another embodiment, the reagent may be deposited on the wafer as part of a deposition process. In another embodiment, the reagent may be used to remove part of a film previously deposited on the wafer. In such a process, the reagent may be used to perform the etching or selectively removing a portion of a composite film, e.g. the organic component of an inorganic-organic composite, or a porogen from a film to produce a porous film.

Alternatively, a mechanism may introduce a reagent directly to the process vessel. Even further, an additive delivery mechanism may introduce a chemical additive to the subcritical solvent before the solvent is made supercritical, instead of after the solvent is made supercritical.

An example of removal of bulk resist and hardened resist from a wafer surface is as follows:
A 4:1 (TMAH in methanol:water) in CO2 with the addition of KRYTOX surfactant.
6% of 4:1 mixture is given below. The KRYTOX surfactant has MW=2500.
mass % 6%(4:1)
CO2 83.083
Methanol 3.852
TMAH 1.284
Water 1.483
KRYTOX surfactant 10.297

The temperature was 70C and pressure was 3000 psi. Complete removal of resist and crust from the wafer surface occured at 6% of the mixture in CO2. The amount of KRYTOX surfactant added is such that mole(water)/mole (KRYTOX surfactant) is 20 (which is the value for stable microemulsion). Complete cleaning does not occur with TMAH under these conditions without the use of KRYTOX surfactant.

While this invention has been described in terms of several preferred embodiments, there are alterations, modifications, permutations, and substitute equivalents which fall within the scope of this invention. It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention. The invention disclosed herein may be practiced without any element which is not specifically disclosed herein. The use of the singular in the claims does not mean "only one", but rather "one or more", unless otherwise stated in the claims.

What is claimed is:

1. A method of delivering a reagent to a wafer, comprising:
providing a solvent;
providing a set of conditions of temperature and pressure to the solvent sufficient to bring the solvent to supercritical conditions;
providing a reagent;
providing a surfactant, wherein the surfactant has a first moiety with an affinity for the solvent and a second moiety with an affinity for the reagent, wherein the surfactant increases the concentration of the reagent carried in the solvent;
combining the solvent, the surfactant, and the reagent to form a solution; and
delivering the solution to a supercritical process chamber, wherein the wafer is exposed to the solution in the supercritical process chamber, where the reagent acts to chemically break down material to accomplish removal of the material from the wafer, wherein the solution is supercritical when entering the supercritical process chamber.

2. The method of claim 1, wherein surfactant increases the concentration of the reagent carried in the supercritical solvent by at least a factor of two.

3. The method of claim 1, wherein the reagent is used to strip photoresist from the wafer where the reagent breaks down polymers by the breaking of chemical bonds.

4. The method of claim 1, wherein both the surfactant and the reagent are used to remove residue from the wafer, wherein the reagent chemically breaks down the residue to enable removal of the residue from the wafer.

5. The method of claim 1, wherein the reagent is used to etch the wafer.

6. The method of claim 1, wherein the reagent has a solubility and the supercritical solvent carries the reagent by dissolving the reagent into the supercritical fluid using the surfactant to increase the reagent's solubility.

7. The method of claim 1, wherein the solvent is carbon dioxide.

8. The method of claim 7, wherein the first moiety of the surfactant is a carbon dioxidephillic tail and the second moiety of the surfactant is a hydrophillic head.

9. The method of claim 1, wherein the surfactant comprises a bi-functional molecular structure.

10. The method of claim 1, further comprising adding a second reagent to the solution, wherein the surfactant increases the solubility of the second reagent in the solvent, where the second reagent acts to break chemical bonds to accomplish the processing of the wafer.

11. The method of claim 1, wherein the solvent comprises at least one of carbon dioxide, carbon monoxide, nitrous oxide, xenon, hydrogen sulfide, ethanethiol, an alkane, an alkene, an aromatic, an alcohol, acetone, hoxafluoroacetone, an alkyl amine, sulfur hexafluoride, ammonia, water, and a chloro, fluoro, and freon short-chain molecule.

12. The method of claim 1, wherein the supercritical solvent carries the reagent by forming a microemulsion from the reagent and surfactant in a supercritical phase.

* * * * *